United States Patent [19]
Taylor et al.

[11] Patent Number: 5,650,738
[45] Date of Patent: Jul. 22, 1997

[54] PRECISION DIGITAL PHASE SHIFT ELEMENT

[75] Inventors: Stephen D. Taylor, Agoura; Howard S. Nussbaum, Los Angeles; Steve I. Hsu, Rancho Palos Verdes; William P. Posey, Palos Verdes Estates, all of Calif.

[73] Assignee: Hughes Aircraft Company, Los Angeles, Calif.

[21] Appl. No.: 576,330

[22] Filed: Dec. 21, 1995

[51] Int. Cl.⁶ .................................................. H03K 23/42
[52] U.S. Cl. ........................ 327/237; 327/231; 327/115; 327/117; 377/48
[58] Field of Search ................................. 327/100, 113, 327/114, 115, 117, 231, 241, 237, 256; 377/47, 48, 52, 107, 109; 364/703

[56] References Cited

U.S. PATENT DOCUMENTS

3,721,904  3/1973  Verhoeven ............................. 327/115
4,870,366  9/1989  Pelletier ................................. 327/52
5,020,079  5/1991  Vancraeynest ........................ 375/64

*Primary Examiner*—Timothy P. Callahan
*Assistant Examiner*—Dinh T. Le
*Attorney, Agent, or Firm*—Leonard A. Alkov; Wanda K. Denson-Low

[57] ABSTRACT

A precision digital phase shift element for achieving precise phase shift of an input pulse train signal. The output is a pulse train at a frequency equal to the input signal frequency divided by N, and having N equally spaced phase states. The relative phase state of the output signal is reliably controlled by selective deletion of pulses from the input signal pulse train. The selective deletion can be achieved by selectively gating the input pulse train, or by use of a dual modulus frequency divider circuit.

12 Claims, 6 Drawing Sheets

PRECISION DIGITAL PHASE SHIFT ELEMENT

CROSS-REFERENCE TO RELATED APPLICATIONS

This application is related to the following co-pending, commonly assigned applications: DIGITAL FREQUENCY DIVIDER PHASE SHIFTER, S. I. Hsu et al., Ser. No. 08/576,329, filed Dec. 21, 1995; DISCRETE PHASE MODULATOR, H. S. Nussbaum et al., Ser. No. 08/576,325, filed Dec. 21, 1995; SYSTEM AND METHOD FOR RADAR RECEIVER HARMONIC DISTORTION AND SPURIOUS RESPONSE CONTROL, W. P. Posey et al., Ser. No. 08/576,327, filed Dec. 21, 1995; PRECISION DIGITAL PHASE SHIFTER, S. D. Taylor et al., Ser. No. 08/576,328, filed Dec. 21, 1995; and DIGITAL COUNTER AND COMPARATOR BASED PRECISION PHASE SHIFT ELEMENT, S. D. Taylor et al., Ser. No. 08/576,326, filed Dec. 21, 1995; the entire contents of these co-pending applications are incorporated herein by this reference.

TECHNICAL FIELD OF THE INVENTION

This invention relates to the field of RF phase shifters, and more particularly to phase shifters employing digital circuitry to achieve precise phase shift control.

BACKGROUND OF THE INVENTION

Certain advanced radar systems under development require noise and spurious performance well beyond that of currently fielded systems. The noise and spurious performance of the variable frequency oscillator (VFO) used for Doppler tuning of main lobe clutter must, in particular, be dramatically improved to be compatible with these application needs. While that improvement may be feasible, the simultaneous improvements in noise, spurious signal content and switching speed is viewed as a design risk. Phase tuning rather than frequency tuning can also be used to effect the Doppler tuning.

The phase tuning approach requires a precision phase shifter. The prior art for electrically tuned phase shifters is wide and diverse, including analog designs using varactor tuning, switched line lengths, tapped delay lines, vector modulators, n-stage reactively terminated quadrature hybrids, and direct digital synthesizers (DDS). With the exception of the DDS, the phase resolution and accuracy that can be achieved from these approaches is limited by fabrication precision, alignment, and parasitic effects. The DDS can achieve the phase resolution of the disclosed approach but, without specialized and complex added circuitry, does not provide the spurious signal performance required for radar application.

SUMMARY OF THE INVENTION

A precision digital frequency divider and phase shift system is described for frequency dividing the frequency (Fclk) of a periodic pulse train and precisely setting the relative phase of the output signal in relation to the prior phase of the output signal. The system includes frequency division circuit means responsive to the periodic input pulse train to produce an output signal having a frequency equal to Fclk/N, where N is an integer, and phase shift control circuit means operatively connected to the frequency division circuit means for selecting the relative output phase of the output signal relative to the prior phase of the output signal to a phase shift magnitude equivalent to 360 C/N degrees, where C is a phase shift control parameter.

The frequency division circuit means in one exemplary embodiment includes a divide-by-N frequency divider circuit, and the phase shift control circuit means includes a gate circuit having an input port connected to receive the input pulse train and an output connected to an input port of the divide-by-N frequency divider circuit. The gate circuit comprising means responsive to a gate signal for selectively propagating said the input train signal to the input port of the frequency divide, wherein one or more pulses comprising the input pulse train are selectively not propagated to the input port to achieve a desired phase shift.

In another embodiment, the frequency divider circuit means includes a dual modulus frequency divider circuit for selectively dividing the frequency of the input pulse train by N or M, the frequency divider circuit having an input port, an output port, and a modulus control port. The input pulse train is received at the divider circuit input port. A divider control circuit generates the modulus control signal, and is responsive to a phase control signal indicative of a phase shift value, to a phase shift strobe signal to initiate the phase shift, and to the system output signal. The divider control circuit commands the dual modulus frequency divider circuit to divide the input pulse train signal frequency by N except during a phase shift time interval during which the frequency divider circuit is commanded to divide the input pulse train signal frequency by M to achieve the desired relative phase shift. The value of M can be equal to N+1, to a fixed integer or rational number, or can be a programmable value.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

A digital phase shifter is described that provides precise phase shifting of an input signal by increments of 360/N degrees, where N is an integer. The input to the phase shifter can be a pulse train, or another waveform that is converted to a square wave or pulse train prior to inputting to the phase shifter. The output is a pulse train at a frequency divided by N and has N equally spaced phase states.

Figure 1:
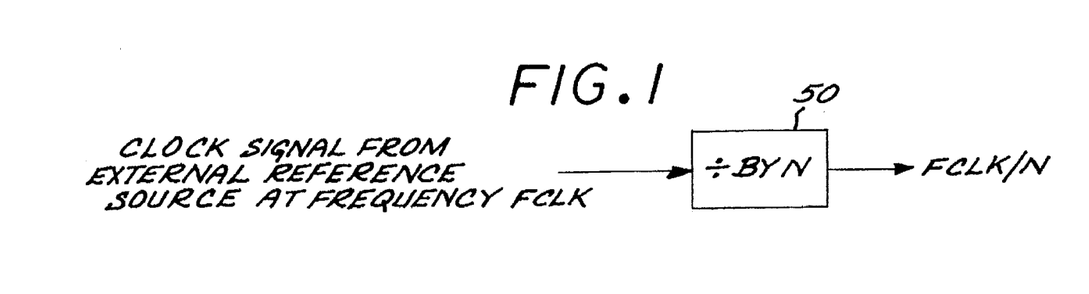
FIG. 1 is a simplified schematic block diagram of a basic frequency divider element.

A basic frequency divider element 50 with a clock signal input at Fclk frequency and an output at frequency Fclk/N is shown in FIG. 1. The output signal phase state from a free running frequency divider is not controlled and will depend on the initial state of the frequency divider. The frequency divider 50 is essentially a digital counter that counts input pulses and outputs a pulse every N input pulses. The phase state is therefore dependent on the initial count in the divider when the input pulse train is applied or when the frequency divider dc power is applied.

Figure 2A:
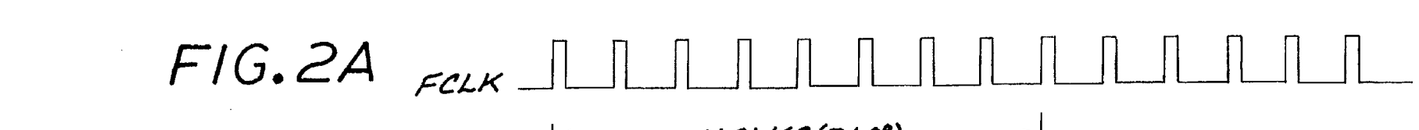
FIGS. 2A–2F illustrate the N possible signal phase states that result from the frequency division process carried out by the phase shift element of FIG. 1.
Figures 2B, 2C:
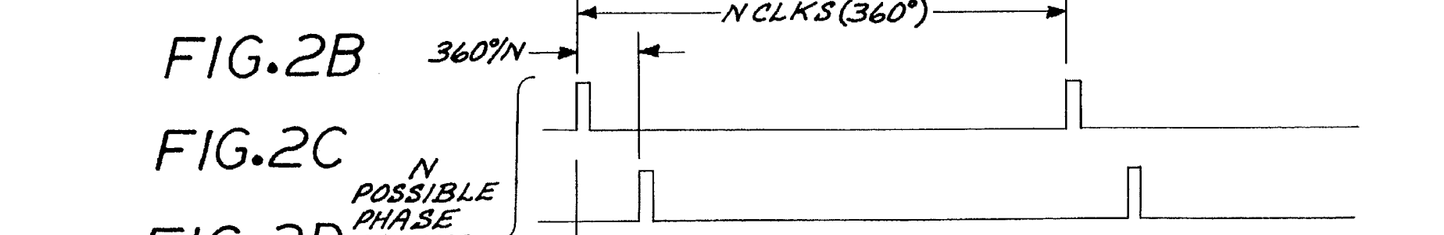
Figures 2D, 2E, 2F:
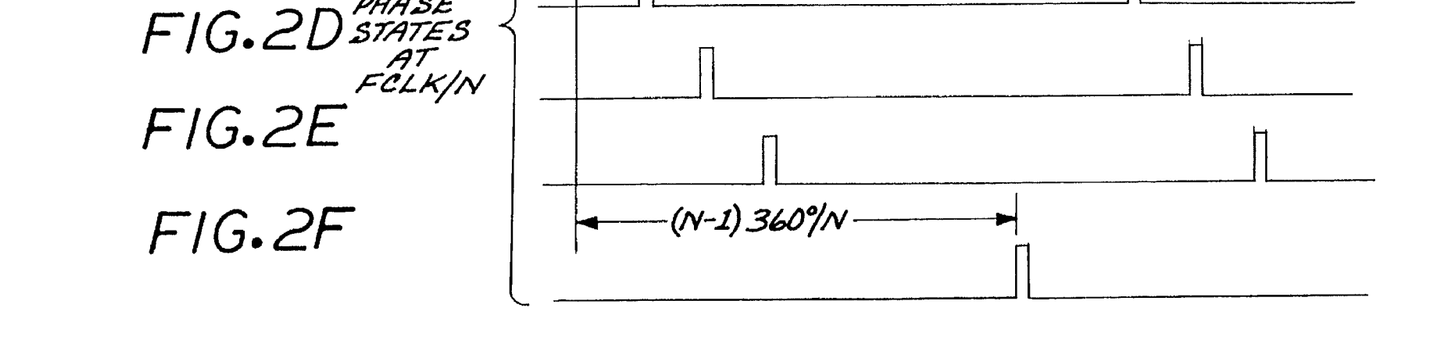

FIG. 2A illustrates the signal waveform of the clock signal input to the frequency divider element 50 of FIG. 1.

FIGS. 2B–2F illustrate the N possible output signal phase states that result from the frequency division process of the circuit of FIG. 1. This behavior of digital frequency dividers is well known.

The invention addresses the means by which the relative phase state of the output signal of the frequency divider can be reliably controlled. Exemplary embodiments for this control are disclosed, and each relies on what is effectively selective deletion of pulses from the input signal pulse train.

Figure 3:
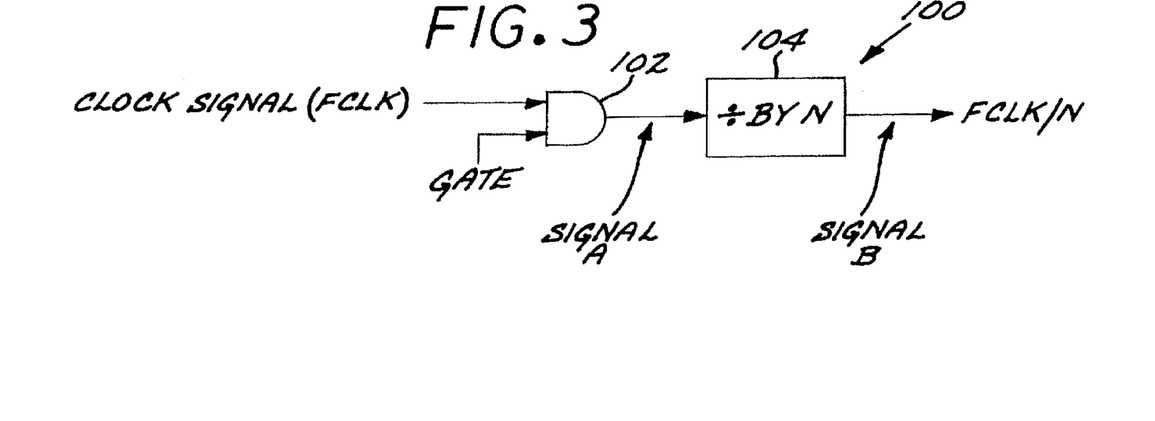
FIG. 3 is a simplified schematic block diagram of a phase shift circuit in accordance with the invention, employing gating input clock signal to control the output signal phase.
Figures 4A, 4B:
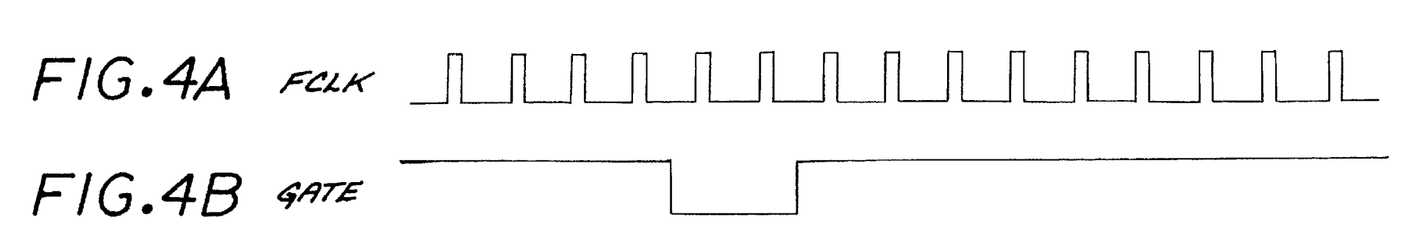
FIGS. 4A–4D are signal timing diagrams which illustrate the operation of the circuit of FIG. 3, for the exemplary configuration in which N=3, and the phase shift=(360/3)2 degrees=240 degrees.
Figures 4C, 4D:
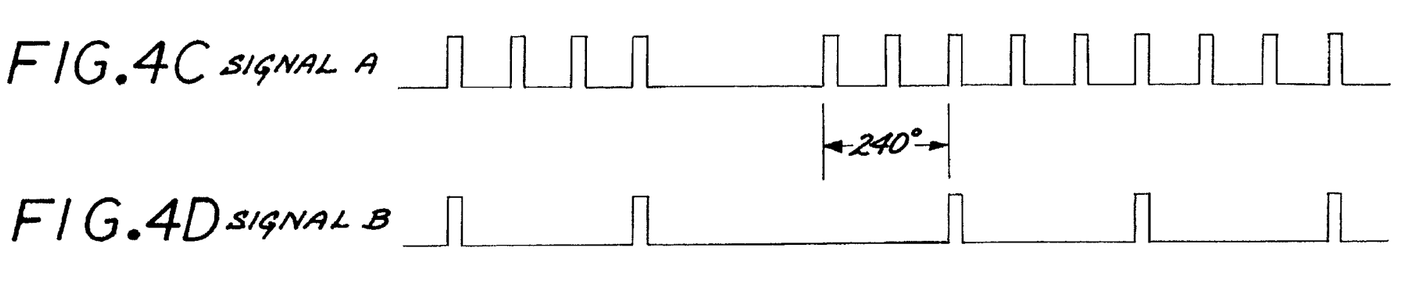

A direct approach to accomplish this pulse deletion is shown in schematic form in FIG. 3; the associated signal timing diagrams are shown in FIG. 4. An input clock signal is connected to one input of AND plate 102 comprising the phase shift system 100. The input clock signal is free running at a constant frequency, Fclk, as shown in the waveform illustrated in FIG. 4A. gate signal (FIG. 4B) applied to the other input to the AND gate 102 determines when the clock signal is applied to the divide-by-N frequency divider 104. When the gate signal is low (logic-0), the AND gate output is held to logic-0, and the clock signal is blocked from reaching the divider 104. When the gate signal is logic-1, the input to the divider is identically the clock signal, as shown in FIG. 4C, which represents the signal at A, the input to the divider 104. The frequency divider maintains its internal state (or count) during the time the divider input is interrupted by the gate signal. When the clock signal is reapplied the divider 104 resumes counting, but the gating action has caused a delay in the generation of subsequent output pulses as shown in FIG. 4D, illustrating the signal at B, the output of the divide-by-N element 104.

For the example shown in FIGS. 4B–4D, the frequency divider 104 is dividing by three and the gating spans two periods of the clock signal. For division by three, there are three possible output signal phase states spaced 120 degrees apart. The two clock signal period gating interval produces a 240 degree phase change to the output signal.

Figure 5:
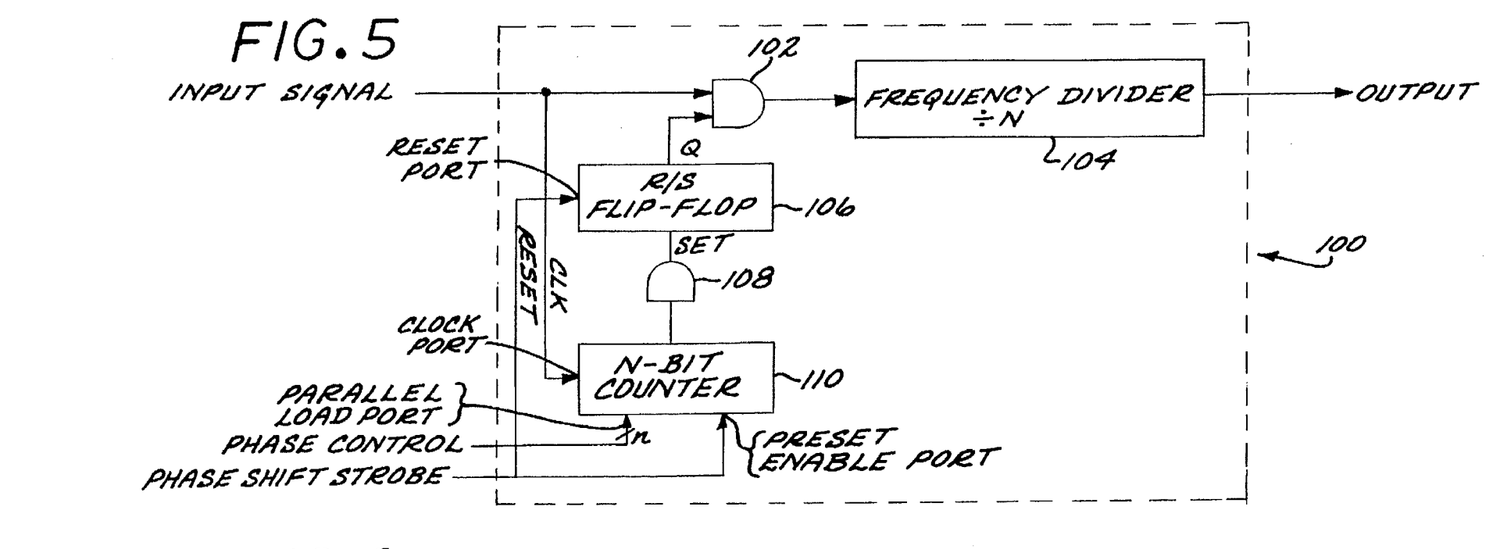
FIG. 5 is a circuit schematic of an exemplary circuit for implementing the functional block diagram of FIG. 3.

An exemplary circuit embodiment of the digital phase shift element 100 illustrated in FIGS. 3 and 4 is shown in FIG. 5. Signals input to the phase shift element include the input signal that is the signal to be frequency divided and phase shifted, an n-bit phase control signal that determines the magnitude of the desired phase shift of the divider output, and a phase shift strobe signal that initiates the actual phase change. When no phase shift is commanded, the input signal is passed through the AND gate 102 and clocks the divide-by-N frequency divider 104 to produce an output at 1/N$^{th}$ the input frequency. The input signal also serves as the input to n-bit counter 110.

To produce a phase change, the n-bit phase control signal is set to the binary number that corresponds to the number of pulses of the input that are to be blocked from reaching the frequency divider 104. The n-bit phase control signal is provided at the parallel load port of the counter 110. If N is selected to be 16 in FIG. 5, the range of the phase control signal will be zero through fifteen resulting in the phase control signal being a 4-bit command word.

The phase shift strobe is a short pulse signal that is applied to initiate the phase shifting process. The phase shift strobe activates the preset enable function of the n-bit counter 110 to load the phase control signal as a starting state in the counter. Simultaneously, the phase shift strobe resets the R/S flip-flop 106 to produce logic-0 at the Q output. The AND gate 102 then blocks the input signal from reaching the frequency divider 104. Subsequent pulses of the input signal inputted to the clock input of the n-bit counter 110 function to decimate the count by one for each input pulse. Thus, the initial value loaded in the counter 110 is progressively decreased by each input signal pulse until zero is reached. At that time, all of the n complemented, Q-bar outputs from the counter 110 become logic-1, and the AND gate 103 driving the R/S flip-flop switches from a logic-0 output to a logic-1 output, setting the R/S flip-flop Q output to logic-1. That logic-1 input to the AND gate 102 allows the input signal to again drive the frequency divider 104 and resume the output pulse train. The deleted input signal pulses have, however, effected the desired phase shift on the output signal.

For the exemplary configuration with N=16, the output phase shift is defined by $$\Delta\theta = -360°C/16 \text{ degrees}$$

where C is the number of input pulses that are deleted. In general, the phase shift is defined by $$\Delta\theta = -360°C/N \text{ degrees}$$

The deletion of input pulses to a frequency divider to effect a controllable and precise phase change in the output signal is one aspect of this invention. The particular details of the logic circuit implementation to program and control the number of input signal pulses that are deleted are merely exemplary. Many other implementations for this programming and control will be apparent to those skilled in the art of digital circuit design.

Figure 6:
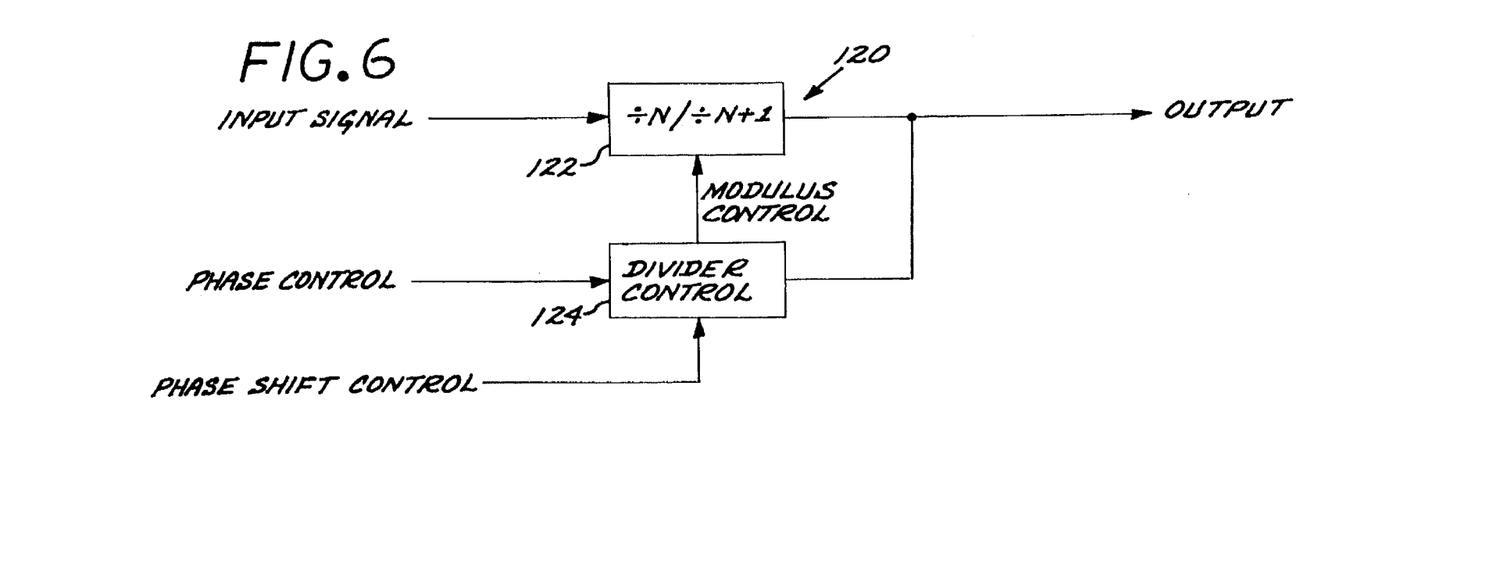
FIG. 6 is a simplified schematic block diagram of a phase shift circuit in accordance with a further aspect of the invention, employing a dual modulus frequency divider as the primary phase shifting element.

A second embodiment of pulse deletion to effect controllable phase shift in accordance with the invention is shown in FIG. 6. The system 120 employs a dual modulus frequency divider 122 as the primary phase shifting element. Such frequency dividers divide the input frequency by N or N+M, depending on the state of an input modulus control signal. N can be any integer but is typically in the range of 3 to 100. M is usually 1 or 2 but could be other integers as well as non-integer values. Dual modulus frequency dividers were originally designed for use with two additional programmable counters in frequency synthesis applications to provide programmable integer frequency division factors in unit steps over a wide range. A divider control circuit 124 provides a modulus control signal to the divider 122 to set the divider modulus.

Figure 7A:
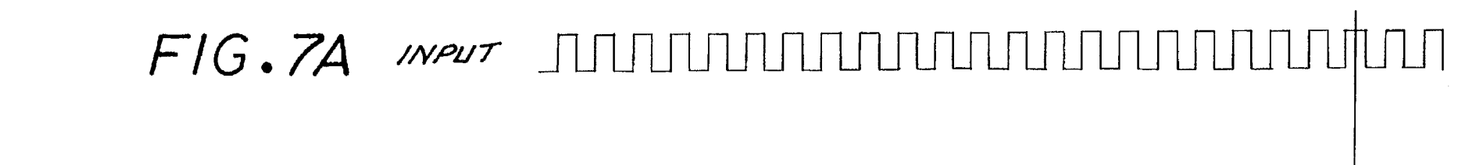
FIGS. 7A, 7B and 7C are signal timing diagrams illustrating the operation of the circuit of FIG. 6, for the case of N=4 and single cycle of division by N+1.
Figure 7B:
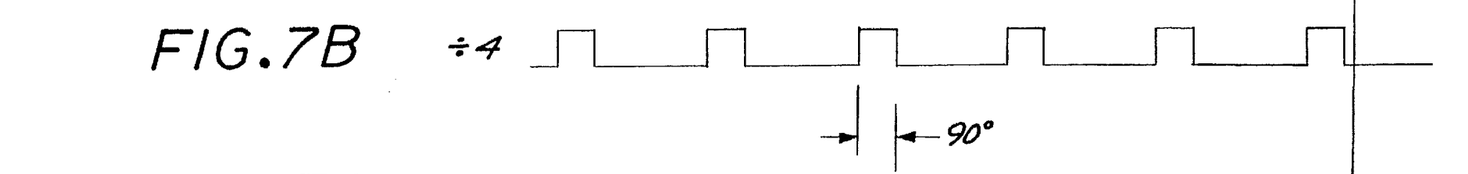
Figure 7C:
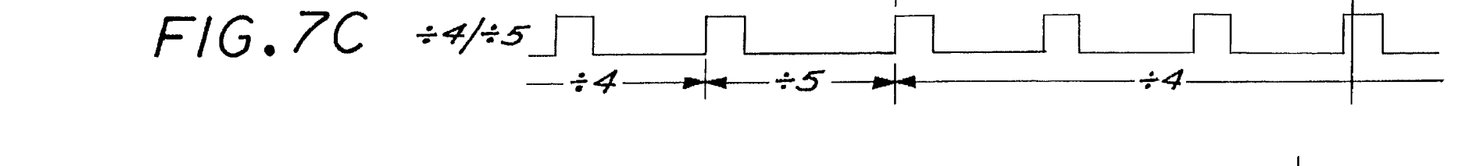

As used in accordance with this invention, the dual modulus frequency divider 122 and the control circuit 124, described below, are not used to programmably alter the output frequency, but rather to provide precise adjustment of the output signal phase. The basic mechanism for this phase adjustment is shown in FIGS. 7A–7C. FIG. 7A shows the input signal, represented as a pulse train, and FIG. 7B shows that signal divided continuously by N (4 in this example). FIG. 7C shows a similar output except that, for one cycle of division, the dual moulus frequency divider is set to divide by N+1 (5 in this example) and then is reset to divide by N. As is seen, the output signal is retarded by $1/N^{th}$ of the period of the signal of FIG. 7B. The relative phase shift is 360/N degrees (90 degrees for N=4).

Figure 8A:
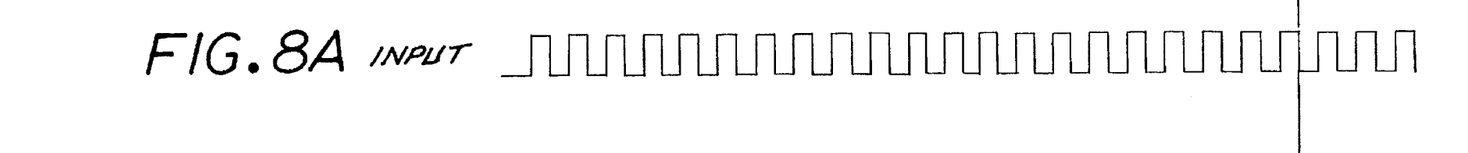
FIGS. 8A, 8B and 8C are signal timing diagrams illustrating the operation of the circuit of FIG. 6, for the case of N=4 and two cycles of division by N+1.
Figure 8B:
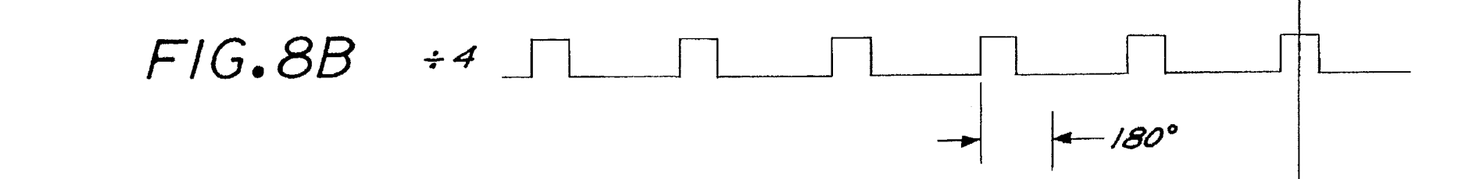
Figure 8C:
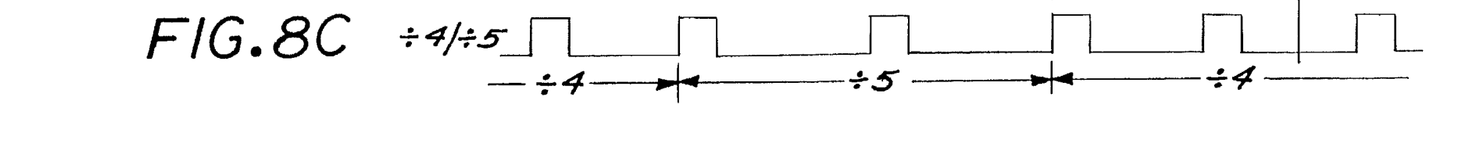

FIGS. 8A–8C are similar to FIG. 7, but show the case with two cycles of division by N+1. The relative phase shift is seen to be 2° (360/N), or 180 degrees in this example. In general, each added circle of division by N+1 will increment an additional 360/N degrees. Thus, if C is the number of cycles of division by N+1, then the resulting phase shift produced in the output signal will be $$\Delta\theta = -360°C/N \text{ degrees}$$

which is identical to the phase shift relationship for the input pulse gating configuration described above. When dividing by N+1, the dual modulus frequency divider produces the same effect as the deletion of an input pulse for each cycle of frequency division by N+1. Specifically, each cycle of division by N+1 has delayed the output pulse by one period of the input pulse frequency as shown in FIGS. 7 and 8.

Figure 9:
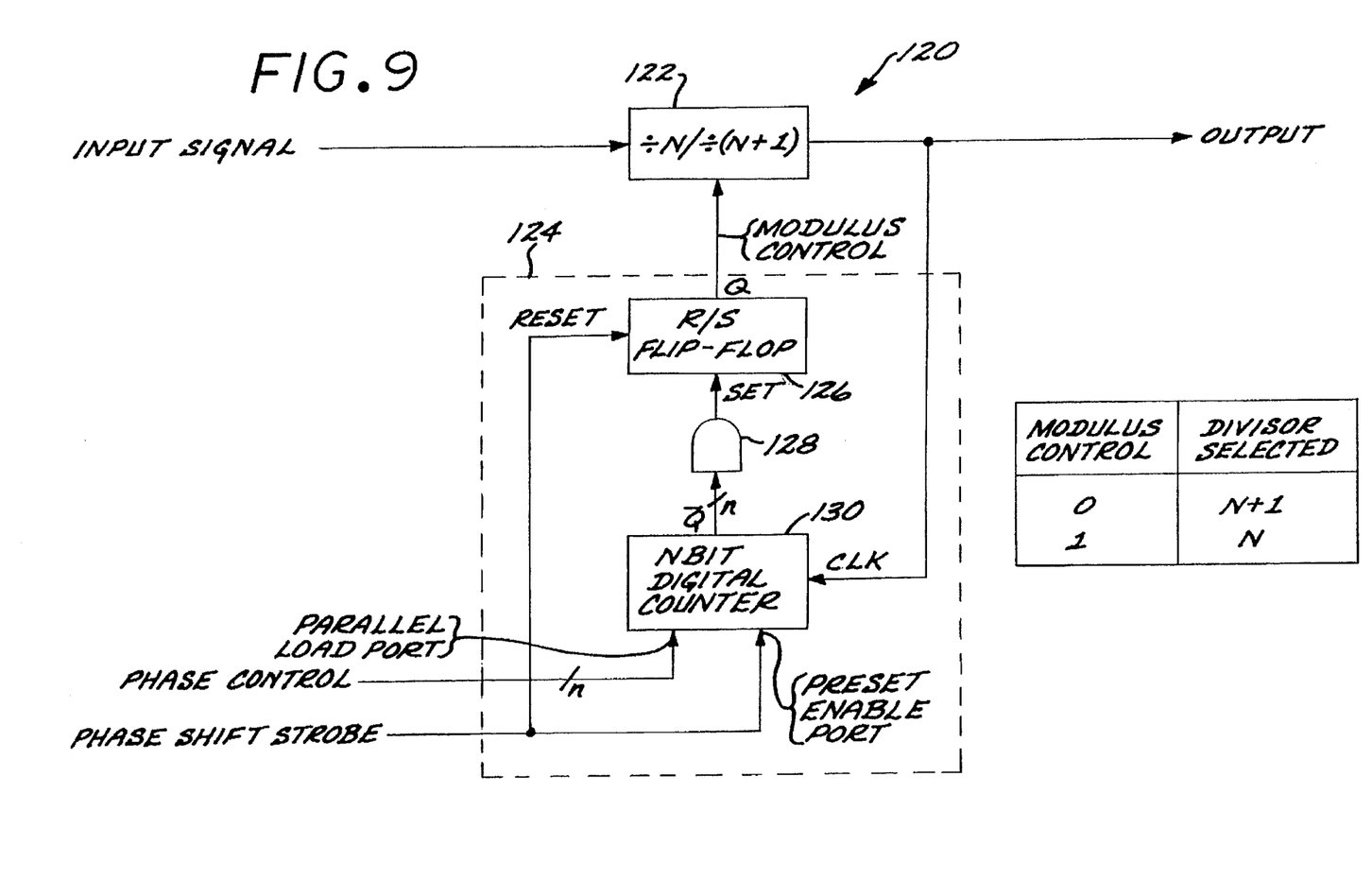
FIG. 9 is a schematic diagram of an exemplary circuit implementation of the phase shift circuit of FIG. 6.

An exemplary circuit implementation of the dual modulus frequency divider based phase shifter 120 of FIGS. 6, 7 and 8 is shown in FIG. 9. The divider control 124 comprises an R/S flip-flop 126, an AND gate 128 and an n-bit digital counter 130, which operate in a similar manner to corresponding elements of the circuit implementation shown in FIG. 5, except that the clock to the counter 130 is taken from the output of divider 122 instead of from the input to the divider. The n-bit phase control signal is applied to the parallel load port of the counter 130. This phase control signal determines the number of cycles that the dual modulus frequency divider 122 will divide by N+1. The phase shift strobe is applied to the preset enable port of the counter 130, to initiate the phase change, and is a pulse signal that functions to load the phase control signal into the n-bit digital counter as an initial value. The phase shift strobe also resets the R/S flip-flop to produce a logic-0 output to the ÷N/÷(N+1), dual modulus frequency divider, setting it to divide by N+1. Subsequently, each output pulse from the ÷N/÷(N+1) frequency divider 122 reduces the count value of the digital counter 130 by one. When the digital counter reaches a value of zero, the n complemented Q-bar outputs from the counter 130 will all be logic-1. That input to the n-input AND gate 128 will cause the set input to the R/S flip-flop 126 to be switched to logic-1, setting the R/S flip-flop output to logic-1. The logic-1 input to the ÷N/÷(N+1) frequency divider will cause the frequency division factor to return to division by N. Thus, the ÷N/÷(N+1) frequency divider will divide the input signal frequency by N+1 for the number of cycles commanded by the phase control signal and then revert to division by N.

It is to be noted that the selective control of the frequency division factor of a dual modulus frequency divider to effect a controllable ad precise phase change in the output signal is a further aspect of this invention. The particular disclosed implementation of the logic circuit used to program and control the number of cycles of division by N+1 is merely exemplary. Many implementations for this programming and control will be apparent to those skilled in the art of digital circuit design.

A difference between the input pulse gating (FIG. 3) and dual modulus frequency division (FIG. 6) approaches is that the gating approach accomplishes all of the commanded phase shift in one gating (or output pulse) interval whereas the dual modulus frequency divider approach with division factors of N and N+1 accomplishes the phase shift progressively over C output pulse intervals.

Figure 10:
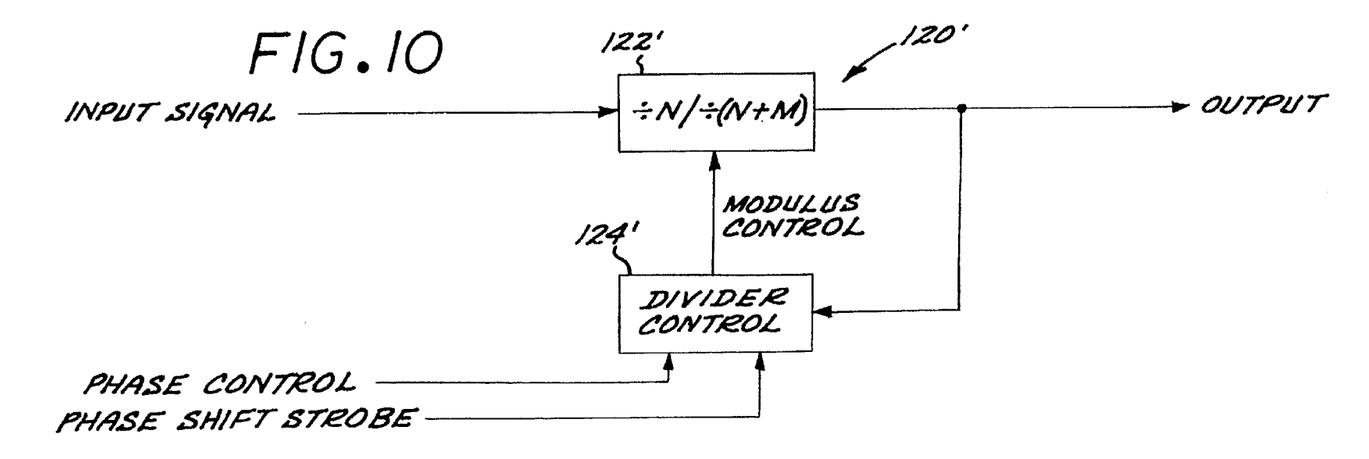
FIG. 10 is a simplified schematic block diagram of a further embodiment of a phase shift circuit in accordance with the invention, employing a dual modulus frequency divider wherein the frequency divider modulus is permitted to be N and N+M, where M may be an rational number.

A third embodiment of the digital phase shifter is shown in FIG. 10 and is an extension of the configuration shown in FIG. 6 to allow the frequency divider modulus of dual modulus divider 122' to be N and N+M, where M may be any rational number (integer, fraction, or integer plus fraction). The functionality of the phase shifter of FIG. 10 is similar to that of FIG. 6, except that the phase shift is defined by $$\Delta\theta = -360°C\cdot M/N \text{ degrees}$$

where C is the number of cycles of frequency division by N+M. The minimum phase shift increment is 360°M/N degrees.

Figure 11:
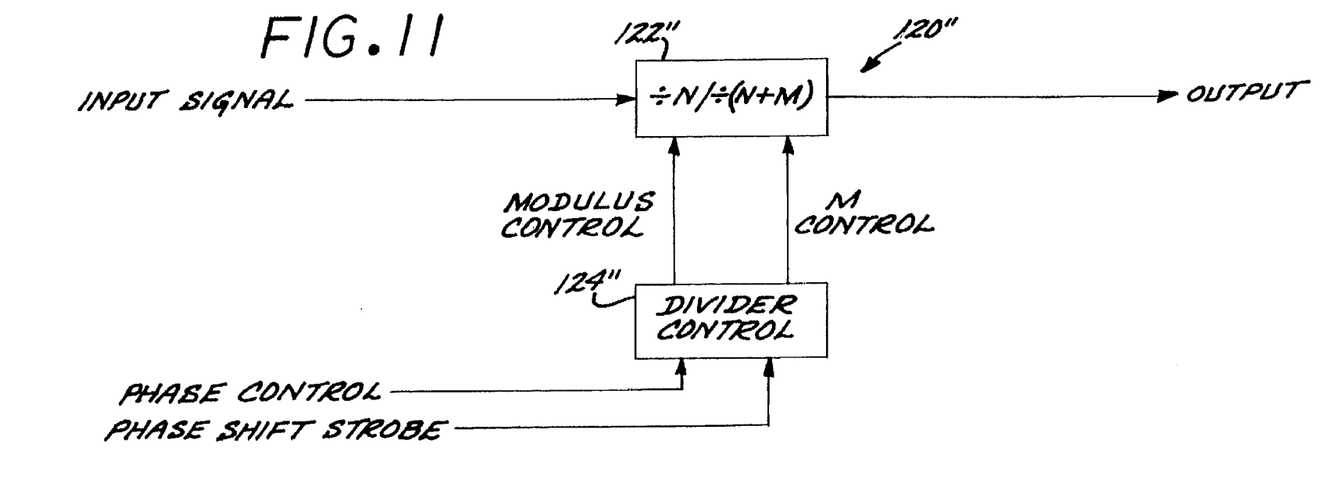
FIG. 11 is a simplified schematic block diagram of a further embodiment of a phase shift circuit in accordance with the invention, similar to the circuit of FIG. 10, but with the further feature of allowing M to be programmable.

A fourth embodiment of the digital phase shifter is shown in FIG. 11 and is an extension of the configuration shown in FIG. 10 to allow M to be programmable. Thus, the divider 122" receives two control signals from divider control circuit 124", the modulus control signal to select which of two modulus are to be applied, and an M control signal to set the value for M. The functionality of the phase shifter 120" is similar to that of divider 120' of FIG. 10, except that frequency division by N+M occurs for only one cycle and M is programmed to produced the desired phase shift defined by $$\Delta\theta = -360°M/N \text{ degrees}$$

The minimum phase shift increment is 360/N degrees for M programmable in integer steps. Programming M over a range of 0 to N−1 will provide phase control over a 360 degree range in 360/N degree increments.

Programming M in fractional steps of K/I where K and I are integers with K programmable and I fixed will provide finer phase control defined by $$\Delta\theta = -360°K/(I\cdot N) \text{ degrees}$$

Programming K over a range from 0 to I·N−1 will provide phase control over 360 degree range in 360/I·N degree increments.

Although the configuration of FIG. 11 requires a more complex multiple modulus frequency divider than the configurations of FIG. 6 and FIG. 10, it provides a commanded phase change in one cycle of frequency division by N+M instead of up to N−1 cycles with the approach of FIG. 6.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A precision digital frequency divider and phase shift system for frequency dividing a frequency Fclk of a periodic pulse train at an input terminal and precisely setting a second phase of an output signal in relation to a first phase of the output signal, comprising:

digital frequency division circuit means responsive to said periodic pulse train to produce said output signal having a frequency equal to Fclk/N, where N is an integer; and programmable digital phase shift control circuit means responsive to a control signal representing a value c which determines a given number of input pulses, which determines a programmable phase shift magnitude and to an externally supplied phase shift strobe signal for initiating a phase shift operation, and wherein said phase shift strobe signal is a different signal from said output signal, said phase shift control circuit means connected to said frequency division circuit means for introducing a phase shift into said output signal, and setting said second phase of said output signal relative to said first phase of said output signal to said phase shift magnitude, wherein said output signal at a time preceding receipt of said phase shift strobe signal has said frequency Fclk/N at said first phase, and at a time subsequent to receipt of said phase shift strobe signal and following introduction of said phase shift has said frequency Fclk/N and said second phase which is offset from said first phase by said phase shift magnitude.

2. The system of claim 1 wherein said frequency division circuit means includes a divide-by-N frequency divider circuit, and said phase shift control circuit means includes a gate circuit having an input port connected to receive said periodic pulse train and an output connected to an input port of said divide-by-N frequency divider circuit, said gate circuit comprising means responsive to a gate signal for selectively propagating said pulse train signal to said input port of said frequency divider, wherein at least one pulse comprising the input pulse train is selectively not propagated to said input port to achieve said phase shift magnitude.

3. The system of claim 2 wherein said gate circuit includes a logical AND gate, wherein said gate circuit is at a logical zero state to prevent said at least one pulse from being propagated to said input port of said frequency divider.

4. The system of claim 2 wherein said control circuit generates said gate signal in response to said control signal and in response to said phase shift strobe signal to initiate introduction of said phase shift.

5. The system of claim 4 wherein said phase control signal is an n-bit digital word, and said control circuit includes an n-bit digital counter clocked by said input pulse train, said counter having N output count states and responsive to said n-bit digital word to set the initial count state of said digital counter, and logic circuit means responsive to said output count state of said counter and to said phase strobe signal to provide said gate signal as its output, said gate signal having a logical one value when no phase shift is commanded, and a logical zero value for a time interval commencing when said phase strobe signal is activated and said counter is preset to said initial count state, and ending upon said counter reaching a predetermined count state.

6. The system of claim 5 wherein said predetermined count state is the maximum count state value.

7. The system of claim 1 wherein said frequency division circuit means includes:

a dual modulus frequency divider circuit for selectively dividing the frequency of said input pulse train by N or N+M, where M is a rational number, said frequency division circuit having an input port, an output port, and a modulus control port, said periodic pulse train being received at said divider circuit input port; and said phase shift control circuit means includes:

a divider control circuit for generating said modulus control signal, said control circuit means responsive to said control signal, to said phase shift strobe signal to initiate said phase shift, and to said system output signal, said divider control circuit to command said dual modulus frequency divider circuit to divide the input pulse train signal frequency by N except during a phase shift time interval during which said frequency divider circuit is commanded to divide the input pulse train signal frequency by N+M to achieve said desired relative phase shift, and wherein the value C determines a number of cycles of division of the input pulse train signal frequency by N+M during said phase shift time interval.

8. The system of claim 7 wherein M is equal to one.

9. The system of claim 7 wherein M is equal to minus one.

10. The system of claim 7 wherein said phase control signal is an n-bit digital word, and said control circuit includes an n-bit digital counter clocked by said output signal, said counter having N output count states and responsive to said n-bit digital word to set the initial count state of said digital counter, and logic circuit means responsive to said output count state of said counter and to said phase strobe signal to provide said modulus control signal as its output, said modulus control signal having a first value for selecting N as said modulus when no phase shift is commanded, and a second value to select N+M as said modulus for a time interval commencing when said phase strobe signal is activated and said counter is preset to said initial count state, and ending upon said counter reaching a predetermined count state to thereby achieve a desired relative phase shift.

11. The system of claim 7 wherein N and M are fixed integer values.

12. The system of claim 7 wherein N is a fixed integer value and M is a programmable value, and wherein said divider control circuit further generates a control signal indicative of said programmable value.

* * * * *